United States Patent
Kim et al.

(10) Patent No.: US 9,130,550 B2
(45) Date of Patent: Sep. 8, 2015

(54) SEMICONDUCTOR DEVICE AND METHOD FOR OPERATING THE SAME

(71) Applicant: SAMSUNG ELECTRONICS CO., LTD., Suwon-si (KR)

(72) Inventors: Chung-Hee Kim, Yongin-si (KR); Min-Su Kim, Hwaseong-si (KR); Ji-Kyum Kim, Seongnam-si (KR); Emil Kagramanyan, Seongnam-si (KR); Dae-Seong Lee, Busan (KR); Gun-Ok Jung, Yongin-si (KR); Uk-Rae Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/295,802

(22) Filed: Jun. 4, 2014

(65) Prior Publication Data
US 2014/0368246 A1    Dec. 18, 2014

(30) Foreign Application Priority Data

Jun. 14, 2013 (KR) .......................... 10-2013-0068463

(51) Int. Cl.
*H03K 3/289* (2006.01)
*H03K 3/037* (2006.01)

(52) U.S. Cl.
CPC ............ *H03K 3/0375* (2013.01); *H03K 3/0372* (2013.01)

(58) Field of Classification Search
None
See application file for complete search history.

(56) References Cited

U.S. PATENT DOCUMENTS

| | | | |
|---|---|---|---|
| 5,654,658 A * | 8/1997 | Kubota et al. ................. | 327/202 |
| 5,920,575 A * | 7/1999 | Gregor et al. ................. | 714/726 |
| 7,180,348 B2 * | 2/2007 | Frederick et al. ............. | 327/199 |
| 7,183,825 B2 * | 2/2007 | Padhye et al. ................. | 327/202 |
| 7,514,975 B2 * | 4/2009 | Frederick et al. ............. | 327/202 |
| 7,936,191 B2 * | 5/2011 | Hong ............................ | 327/143 |
| 8,352,815 B2 * | 1/2013 | Frederick, Jr. ................ | 714/726 |
| 2002/0000858 A1 * | 1/2002 | Lu ................................ | 327/202 |
| 2006/0273837 A1 * | 12/2006 | Shimazaki et al. ........... | 327/202 |
| 2007/0063752 A1 | 3/2007 | Kowalczyk et al. | |
| 2007/0273420 A1 * | 11/2007 | Torvi et al. .................... | 327/202 |
| 2008/0218234 A1 * | 9/2008 | Jain .............................. | 327/202 |
| 2009/0066386 A1 * | 3/2009 | Lee .............................. | 327/202 |
| 2009/0213668 A1 * | 8/2009 | Zhang et al. ............. | 365/189.011 |
| 2009/0267671 A1 * | 10/2009 | Brown ......................... | 327/202 |
| 2010/0141322 A1 * | 6/2010 | Chua-Eoan .................. | 327/202 |
| 2010/0308881 A1 * | 12/2010 | Uemura et al. .............. | 327/202 |

(Continued)

FOREIGN PATENT DOCUMENTS

| | | |
|---|---|---|
| JP | 4-174013 A | 6/1992 |
| JP | 2009-541743 A | 11/2009 |

(Continued)

*Primary Examiner* — Lincoln Donovan
*Assistant Examiner* — Khareem E Almo
(74) *Attorney, Agent, or Firm* — Sughrue Mion, PLLC

(57) ABSTRACT

Provided are a semiconductor device and a method for operating a semiconductor device. The semiconductor device includes a clock generating unit receiving a reference clock and generating first and second clocks that are different from each other from the reference clock; a first latch configured to receive input data based on the first clock and to output the input data as first output data; and a second latch configured to receive the first output data based on the second clock and to output the first output data as second output data, wherein a first edge of the first clock does not overlap a first edge of the second clock, and at least a part of a second edge of the first clock overlaps a second edge of the second clock.

17 Claims, 12 Drawing Sheets

(56) References Cited

U.S. PATENT DOCUMENTS

| | | | |
|---|---|---|---|
| 2011/0248759 A1* | 10/2011 | Chi et al. | 327/202 |
| 2012/0068749 A1* | 3/2012 | Sood et al. | 327/202 |
| 2012/0229187 A1* | 9/2012 | Choudhury et al. | 327/202 |
| 2013/0021076 A1* | 1/2013 | Kuenemund et al. | 327/202 |
| 2013/0043921 A1* | 2/2013 | Dixit et al. | 327/202 |
| 2013/0154708 A1* | 6/2013 | Zhang et al. | 327/202 |
| 2013/0173977 A1* | 7/2013 | Gurumurthy et al. | 714/726 |

FOREIGN PATENT DOCUMENTS

| | | | |
|---|---|---|---|
| JP | 2010-252012 | A | 11/2010 |
| KR | 1995-0013403 | B1 | 11/1995 |
| KR | 10-0199272 | B1 | 4/1997 |
| KR | 1999-023415 | A | 3/1999 |
| KR | 10-2011-0077665 | A | 7/2011 |
| KR | 10-1120256 | B1 | 3/2012 |

\* cited by examiner

FIG. 8
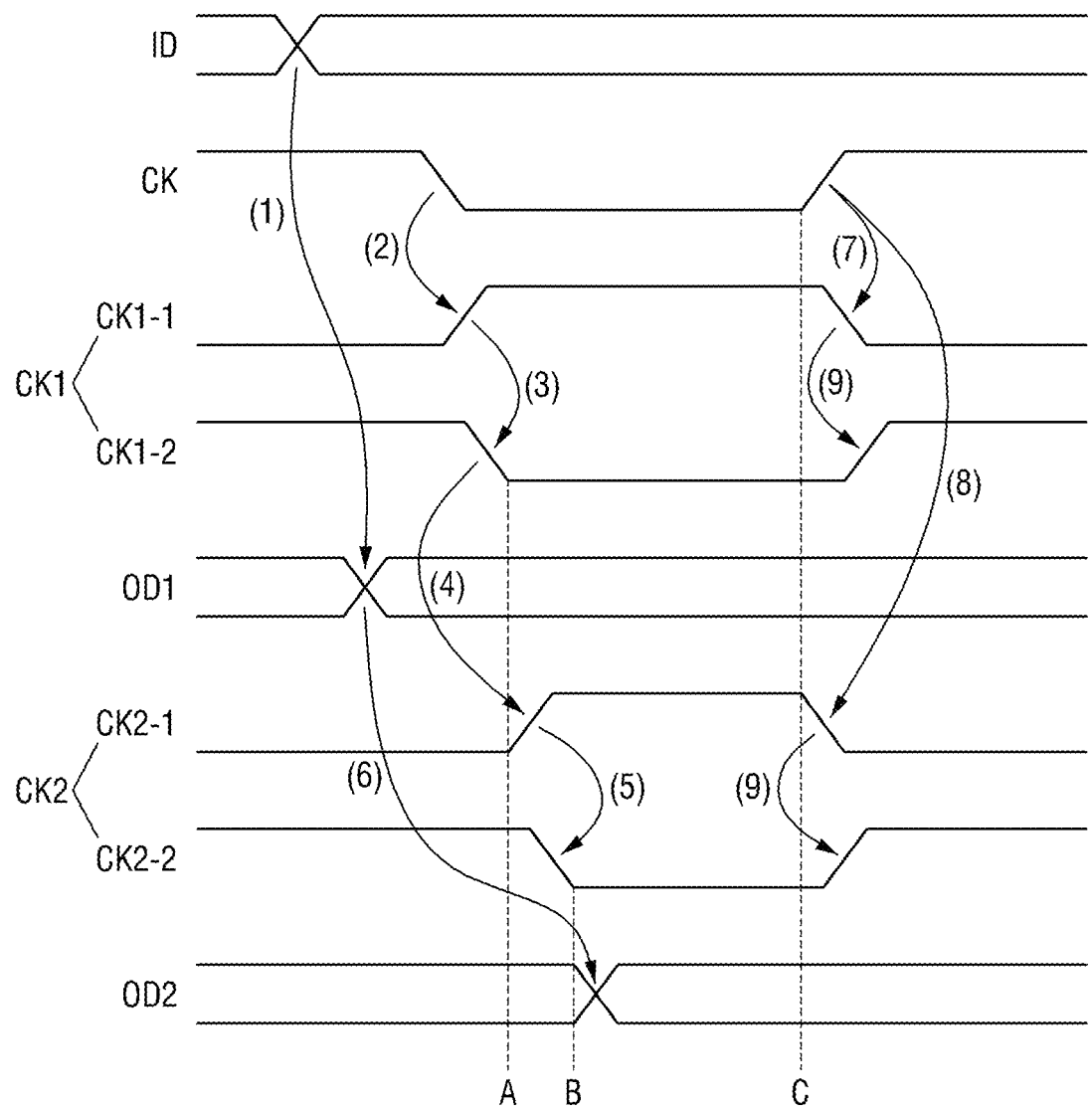
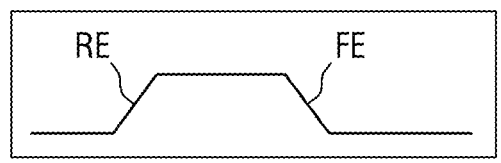

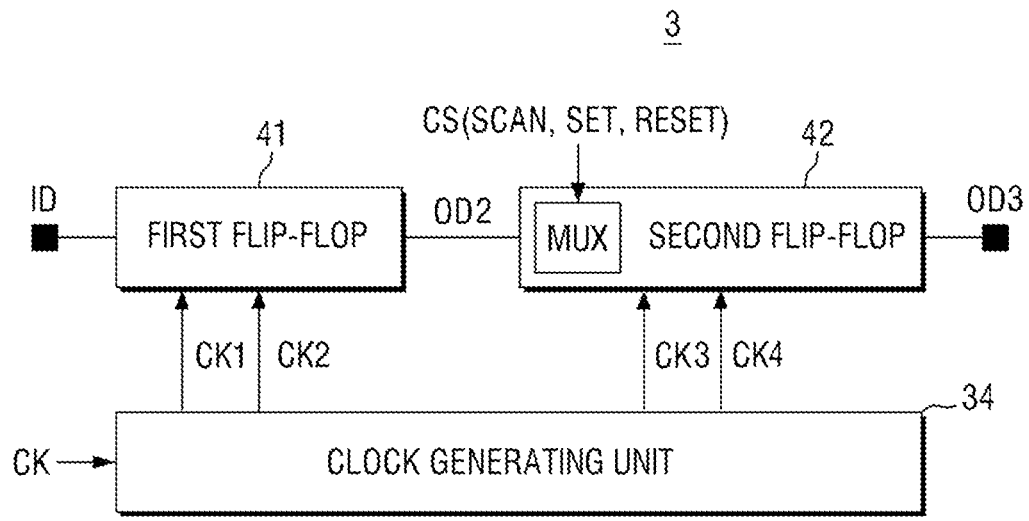

1000

1100

1200

SEMICONDUCTOR DEVICE AND METHOD FOR OPERATING THE SAME

CROSS-REFERENCE TO RELATED APPLICATIONS

This application is based on and claims priority from Korean Patent Application No. 10-2013-0068463, filed on Jun. 13, 2013 in the Korean Intellectual Property Office, the disclosure of which is incorporated herein in its entirety by reference.

BACKGROUND

1. Field

Apparatuses and methods consistent with exemplary embodiments relate to a semiconductor device.

2. Description of the Prior Art

As one of semiconductor devices, a flip-flop operates to store input data in response to a clock signal and to sequentially transfer the stored data. A plurality of flip-flops may be used to transfer data.

According to a recent trend of developing high-speed electronic devices, the speed of a clock signal that is provided to a flip-flop becomes high. In order to reliably operate a plurality of flip-flops in these devices, it is required that timing fail do not occur during operations of the flip-flops regardless of the high-speed clock signal.

SUMMARY

One or more exemplary embodiments provide a semiconductor device having improved operation reliability.

One or more exemplary embodiments also provide a method for operating a semiconductor device having improved operation reliability.

Advantages, subjects, and features of the inventive concept will be set forth in part in the description which follows and in part will become apparent to those having ordinary skill in the art upon examination of the following or may be learned from practice of the inventive concept.

According to an aspect of an exemplary embodiment, there is provided a semiconductor device comprising: a clock generating unit receiving a reference clock and generating first and second clocks that are different from each other from the reference clock; a first latch configured to receive input data based on the first clock and to output the input data as first output data; and a second latch configured to receive the first output data based on the second clock and to output the first output data as second output data, wherein a first edge of the first clock does not overlap a first edge of the second clock, and at least a part of a second edge of the first clock overlaps a second edge of the second clock.

According to an aspect of another exemplary embodiment, there is provided a method for operating a semiconductor device comprising: generating a first edge of a first clock from a first edge of a reference clock and disabling a first latch; generating a first edge of a second clock that does not overlap the first edge of the first clock from the first edge of the first clock and enabling a second latch; and generating a second edge of the first clock from a second edge of the reference clock and enabling the first latch, and generating a second edge of the second clock that overlaps the second edge of the first clock from the second edge of the reference clock and disabling the second latch.

BRIEF DESCRIPTION OF THE DRAWINGS

The above and other objects, features and advantages will be more apparent from the following detailed description taken in conjunction with the accompanying drawings, in which:

FIGS. 8 and 9 are diagrams explaining operations of a semiconductor device according to other exemplary embodiments;

FIG. 10 is a block diagram of a semiconductor device according to another exemplary embodiment;

DETAILED DESCRIPTION OF THE EXEMPLARY EMBODIMENTS

Figure 1:
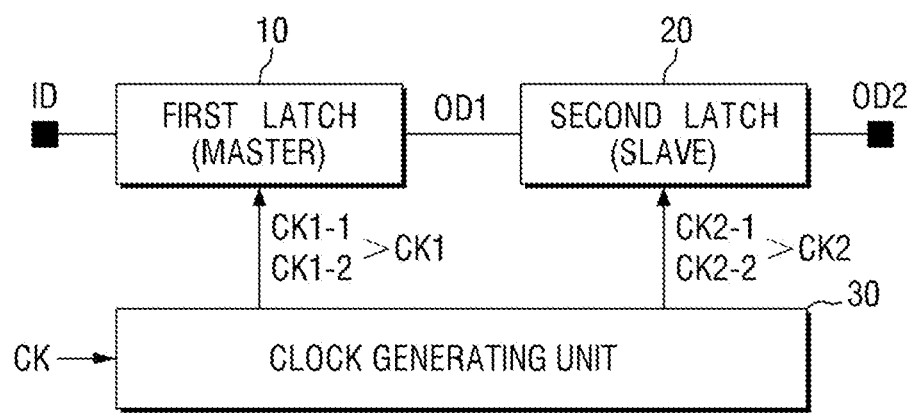
FIG. 1 is a block diagram of a semiconductor device according to an exemplary embodiment.

Advantages and features inventive concept and methods of accomplishing the same may be understood more readily by reference to the following detailed description of exemplary embodiments and the accompanying drawings. The present inventive concept may, however, be embodied in many different forms and should not be construed as being limited to the embodiments set forth herein. Rather, these embodiments are provided such that this disclosure will be thorough and complete and will fully convey the inventive concept to those skilled in the art, and the present inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context.

The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings inventive concept.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, a semiconductor device according to an exemplary embodiment will be described with reference to FIGS. 1 to 3.

FIG. 1 is a block diagram of a semiconductor device according to an exemplary embodiment. FIG. 2 is an exemplary circuit diagram of a master latch and a slave latch of FIG. 1, and FIG. 3 is an exemplary circuit diagram of a clock generating unit of FIG. 1.

First, referring to FIG. 1, a semiconductor device 1 includes a first latch 10, a second latch 20, and a clock generating unit 30.

Here, the term "unit" or "module", as used herein, means, but is not limited to, a software or hardware component, such as field-programmable gate array (FPGA) or application-specific integrated circuit (ASIC), which performs certain tasks. However, the "unit" or "module" is not limited to software or hardware. A "unit" or "module" may advantageously be configured to reside on the addressable storage medium and configured to execute on one or more processors. Thus, a "unit" or "module" may include, by way of example, components, such as software components, object-oriented software components, class components and task components, processes, functions, attributes, procedures, subroutines, segments of program codes, drivers, firmware, microcode, circuitry, data, databases, data structures, tables, arrays, and variables. The functionality provided for in the components and "units" or "modules" may be combined into fewer components and "units" or "modules" or further separated into additional components and "units" or "modules".

The first latch 10 may receive input data ID based on a first clock CK1 and may output the same as first output data OD1. In this embodiment, the first clock CK1 may be received from the clock generating unit 30. The first latch 10 may be a master latch, but the inventive concept is not limited thereto.

The second latch 20 may receive the first output data OD1 input from the first latch 10 based on a second clock CK2, and may output the same as second output data OD2. In this embodiment, the second clock CK2 may also be received from the clock generating unit 30. The second latch 20 may be a slave latch, but the inventive concept is not limited thereto. Further, in this embodiment, the semiconductor device 1 may be a master or slave flip-flop, but the inventive concept is not limited thereto.

On the other hand, the first clock CK1 that is provided to the first latch 10 may include a first sub-clock CK1-1 and a second sub-clock CK1-2, and the second clock CK2 that is provided to the second latch 20 may include a third sub-clock CK2-1 and a fourth sub-clock CK2-2. Hereinafter, a configuration which divides the first clock CK1 and the second clock CK2 into a plurality of sub-clocks and applies the plurality of sub-clocks to the first and second latches 10 and 20 will be exemplarily described, but the inventive concept is not limited thereto.

Figure 2:
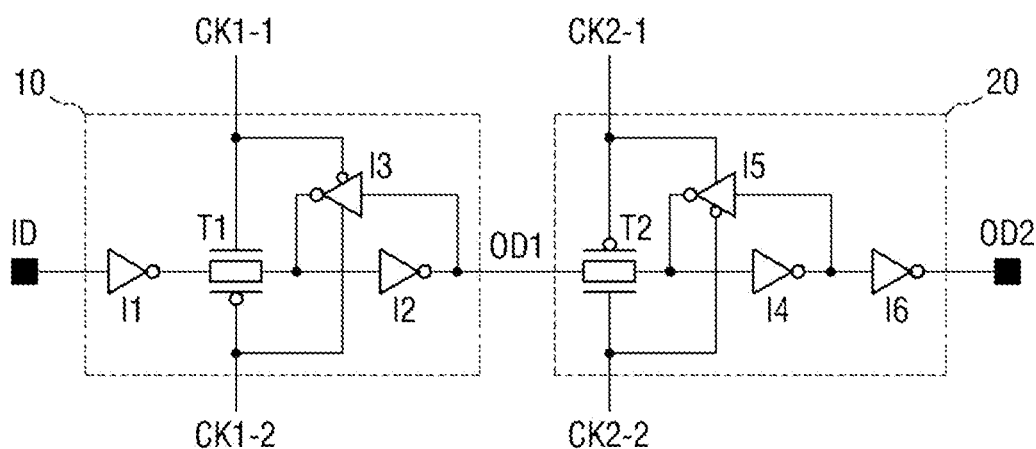
FIG. 2 is an exemplary circuit diagram of a master latch and a slave latch of FIG. 1.

Referring to FIG. 2, the first latch 10 may include, for example, a first inverter I1, a first transfer gate T1, a second inverter I2, and a third inverter I3.

The first transfer gate T1 may be controlled by the first sub-clock CK1-1 and the second sub-clock CK1-2, which are provided to both terminals thereof, and may determine whether to transfer the input data ID that is inverted by and input from the first inverter I1. Specifically, the first sub-clock CK1-1 may be provided to one terminal of the first transfer gate T1, and the second sub-clock CK1-2 may be provided to the other terminal of the first transfer gate T1. As described above, the input data ID may be inverted by the first inverter I1 to be provided to the first transfer gate T1.

The second inverter I2 and the third inverter I3 may latch the input data ID that is provided from the first transfer gate T1. The latched data may be output as first output data OD1. The detailed operations of such elements will be described later.

The second latch 20 may include, for example, a second transfer gate T2 and fourth to sixth inverters I4 to I6.

The second transfer gate T2 may be controlled by the third sub-clock CK2-1 and the fourth sub-clock CK2-2, which are provided to both terminals thereof, and may determine whether to transfer the first output data OD1 that is input from the first latch 10. Specifically, the third sub-clock CK2-1 may be provided to one terminal of the second transfer gate T2, and the fourth sub-clock CK2-2 may be provided to the other terminal of the second transfer gate T2. The first output data OD1 may be provided to the second transfer gate T2 without being inverted.

The fourth inverter I4 and the fifth inverter I5 may latch the first output data OD1 that is provided from the second transfer gate T2. The latched data may be inverted through the sixth inverter I6, and may be output as second output data OD2. The detailed operations of such elements will be described later.

Referring again to FIG. 1, the clock generating unit 30 may receive a reference clock CK, and may generate the first and second clocks CK1 and CK2 from the reference clock CK. Specifically, the clock generating unit 30 may receive the reference clock CK, and may generate the first clock CK1, that includes the first sub-clock CK1-1 and the second sub-clock CK1-2, and the second clock CK2 that includes the third sub-clock CK2-1 and the fourth sub-clock CK2-2, from the reference clock CK.

In this embodiment, the first clock CK1 and the second clock CK2 may be different from each other. Specifically, the first clock CK1 and the second clock CK2 may be generated such that at least one of edges of the first clock CK1 and the second clock CK2 becomes a non-overlap edge. More specifically, the first clock CK1 and the second clock CK2 may be generated such that the first edge of the first clock CK1 does not overlap the first edge of the second clock CK2 and at least a part of the second edge of the first clock CK1 overlaps the second edge of the second clock CK2.

Figure 3:
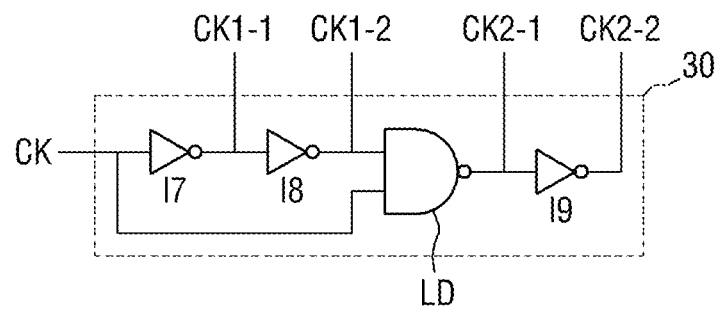
FIG. 3 is an exemplary circuit diagram of a clock generating unit of FIG. 1.

Referring to FIG. 3, the clock generating unit 30 may include seventh to ninth inverters I7 to I9 and a second clock level determining unit LD.

The first sub-clock CK1-1 constituting the first clock CK1 may be generated by inverting the reference clock CK at the seventh inverter I7. The second sub-clock CK1-2 constituting the first clock CK1 may be generated by inverting the first sub-clock CK1-1 at the eighth inverter I8.

The third sub-clock CK2-1 constituting the second clock CK2 may be generated according to an output of the second clock level determining unit LD. In this embodiment, the second clock level determining unit LD may be, for example, a NAND gate which receives the reference clock CK as a first input and receives the second sub-clock CK1-2 as a second input, but the inventive concept is not limited thereto. The third sub-clock CK2-1 constituting the second clock CK2 may be the output of the second clock level determining unit LD. The fourth sub-clock CK2-2 constituting the second clock CK2 may be generated by inverting the third sub-clock CK2-1 at the ninth inverter I9.

Through the above-described configuration, an operation reliability of the semiconductor device 1 according to this embodiment can be improved. Hereinafter, this will be described in more detail with reference to FIGS. 4 and 5.

Figure 4:
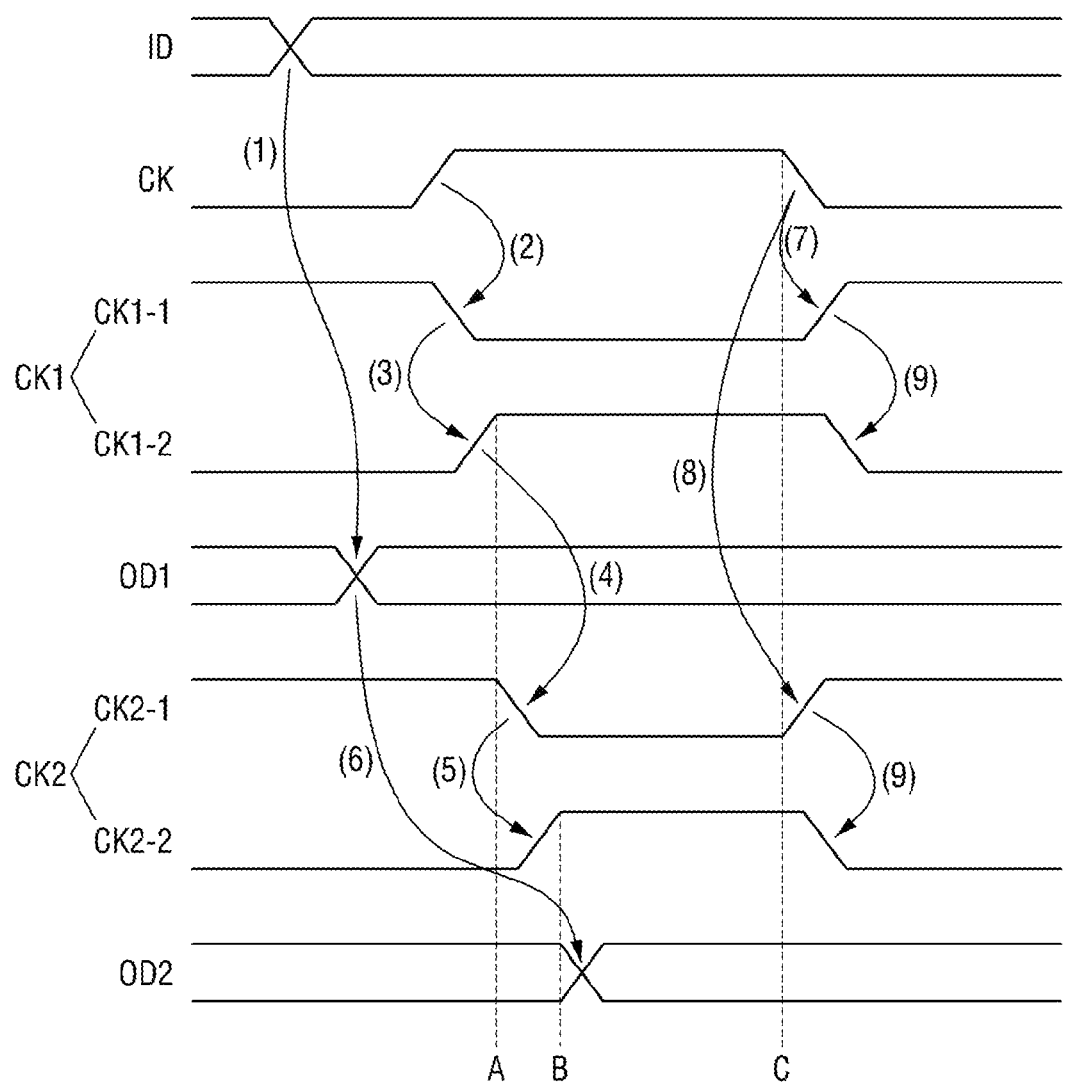
FIGS. 4 and 5 are diagrams explaining operations of a semiconductor device according to exemplary embodiments.
Figures 5, 6:
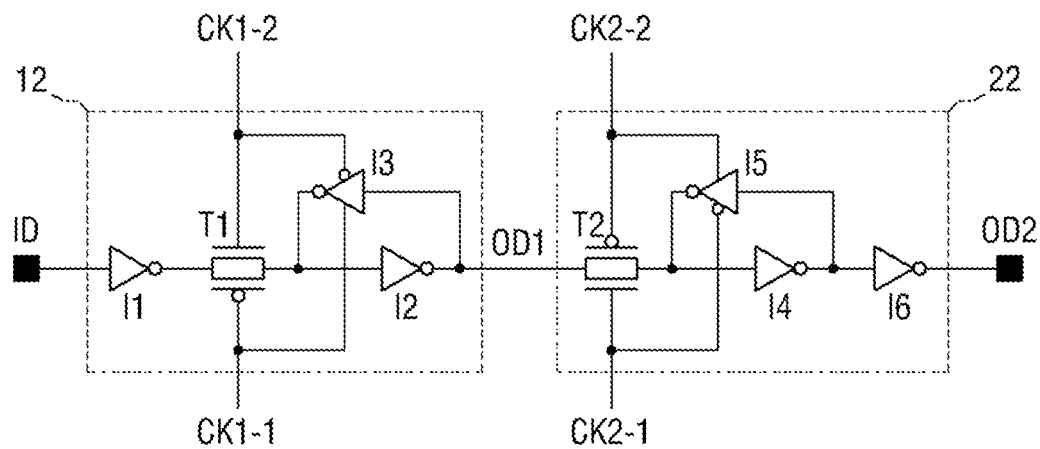
FIGS. 6 and 7 are exemplary circuit diagrams explaining a semiconductor device according to other exemplary embodiments.

FIGS. 4 and 5 are diagrams explaining operations of a semiconductor device according to exemplary embodiments. FIG. 4 is a diagram illustrating operation timing of the semiconductor device according to an exemplary embodiment, and FIG. 5 is a diagram illustrating outputs of the second clock level determining unit LD of FIG. 3 based on inputs thereof, according to an exemplary embodiment.

First, referring to FIG. 4, if the input data ID is applied to the first latch 10, the input data ID is output as the first output data OD1 through the first latch 10 (operation (1)). Specifically, since the reference clock CK is at a low level when the input data ID is applied, the first sub-clock CK1-1 becomes a high level, and the second sub-clock CK1-2 becomes a low level. Such a relationship between the reference clock CK and the first and second sub-clocks CK1-1 and CK1-2 can be easily analogized from the configuration of the clock generating unit 30 as described above in reference to FIG. 3, and thus, the detailed description thereof will be omitted.

If the first sub-clock CK1-1 is at a high level and the second sub-clock CK1-2 is at a low level, the first transfer gate T1 is turned on. Accordingly, the first latch 10 is in an enabled state, and the input data ID is latched and then is output as the first output data OD1. At this time, since the third sub-clock Ck2-1 is at a high level and the fourth sub-clock CK2-2 is at a low level, the second transfer gate T2 is turned off. That is, since the second latch 20 is in a disabled state, the first output data OD1 is unable to be latched onto the second latch 20.

Then, if a rising edge RE of the reference clock CK is formed, a falling edge FE of the first sub-clock Ck1-1 is formed after a predetermined time delay through the seventh inverter I7 (operation (2)). If the falling edge FE of the first sub-clock CK1-1 is formed, a rising edge RE of the second sub-clock CK1-2 is formed after a predetermined time delay through the eighth inverter I8 (operation (3)). Accordingly, the first sub-clock CK1-1 becomes a low level and the second sub-clock CK1-2 becomes a high level. Accordingly, the first transfer gate T1 is turned off. In other words, the first latch 10 is disabled.

Here, if the second sub-clock CK1-2 becomes a high level, a falling edge FE of the third sub-clock CK2-1 is formed (operation (4)). This will be described in detail as follows. As described above, the second clock level determining unit LD according to this embodiment may include a NAND gate which receives the reference clock CK as the first input and receives the second sub-clock CK1-2 as the second input. The outputs (i.e., the third sub-clock CK2-1) of the second clock level determining unit LD according to the inputs thereof are illustrated in FIG. 5.

Since the reference clock CK is kept at a high level while the rising edge RE of the second sub-clock CK1-2 is formed, the output level is changed to a low level only when the level of the second sub-clock CK1-2 is changed to a high level. Accordingly, after the rising edge RE of the second sub-clock CK1-2 is formed, the falling edge of the third sub-clock CK2-1 is formed (operation (4)).

Referring again to FIG. 4, if the falling edge FE of the third sub-clock CK2-1 is formed, a rising edge RE of the fourth sub-clock CK2-2 is formed after a predetermined time delay by the ninth inverter I9 (operation (5)). Accordingly, the third sub-clock CK2-1 becomes a low level, and the fourth sub-block Ck2-2 becomes a high level. Accordingly, the second transfer gate T1 is turned on. In other words, the second latch 20 is enabled. Accordingly, the first output data OD1 is latched onto the second latch 20, and then is output as the second output data OD2 (operation (6)).

If the falling edge FE of the reference clock CK is formed, the rising edge RE of the first sub-clock CK1-1 is formed after a predetermined time delay by the seventh inverter I7 (operation (7)). On the other hand, if the falling edge FE of the reference clock CK is formed, the level of the reference clock CK is changed, and as illustrated in FIG. 5, the level of the third sub-clock CK2-1 is immediately changed. Accordingly, the rising edge RE of the third sub-clock CK2-1 is formed (operation (8)). That is, the operation to form the rising edge RE of the third sub-click CK2-1 is different from the operation to form the falling edge FE of the third sub-clock CK2-1. Specifically, in order to form the falling edge FE of the third sub-clock CK2-1, it is required to additionally form the rising edge RE of the second sub-clock CK2-1 after forming the rising edge RE of the reference clock CK. However, in order to form the rising edge RE of the third sub-clock CK2-1, it is enough to form the falling edge FE of the reference clock CK only. The above-described difference in operation may be understood as the characteristic of the NAND gate constituting the second clock level determining unit LD according to this embodiment.

In accordance with the operational characteristic as described above, the falling edge FE of the third sub-clock CK2-1 constituting the second clock CK2 is unable to be formed to overlap the falling edge FE of the first sub-clock CK1-1 or the rising edge RE of the second sub-clock CK1-2, but at least a part of the rising edge RE of the third sub-clock CK2-1 constituting the second clock CK2 can be formed to overlap the rising edge RE of the first sub-clock CK1-1 constituting the first clock CK1 or the falling edge FE of the second sub-clock CK1-2.

If the rising edge RE of the first sub-clock CK1-1 and the rising edge RE of the third sub-clock CK2-1 are formed as described above, the falling edge FE of the second sub-clock CK1-2 and the falling edge FE of the fourth sub-clock CK2-2 are formed after a predetermined time delay by the eighth inverter I8 and the ninth inverter I9, respectively (operation (9)).

The operation of the semiconductor device 1 according to this embodiment as described above is summarized as follows.

First, the falling edge FE of the third sub-clock CK2-1 constituting the second clock CK2 is formed by the second clock level determining unit LD only after the rising edge RE of the second sub-clock CK1-2 constituting the first clock CK1 is formed. Accordingly, the first latch 10 is disabled at time point A in FIG. 4, and the second latch 20 is enabled at time point B in FIG. 4.

That is, since the falling edge FE of the third sub-clock CK2-1 constituting the second click CK2 is unable to be formed to overlap the rising edge RE of the second sub-clock CK1-2 constituting the first clock CK1, enabling and disabling operations of the first latch 10 and the second latch 20 are sequentially performed.

If the enabling and disabling operations of the first latch 10 and the second latch 20 are not sequentially performed like the above operations, the input data ID is not output as the second output data OD2 to match a clock signal, but instead, data, which has already been stored in the first latch 10 or the second latch 20 may be output as the second output data OD2 regardless of the input data ID. Such a malfunction causes a sampling window of the semiconductor device 1 (e.g., the flip-flop) to be wide, and thus the operation reliability of the device deteriorates.

However, according to the semiconductor device 1 according to this embodiment, through the above-described configuration, a possible malfunction is intercepted in advance, and thus the operation reliability of the semiconductor device 1 can be improved.

On the other hand, after time point C in FIG. 4, the first latch 10 is enabled, and the second latch 20 is disabled. In this case, as described above, at least a part of the rising edge RE of the third sub-clock CK2-1 constituting the second clock CK2 is formed to overlap the rising edge RE of the first sub-clock CK1-1 constituting the first clock Ck1 or the falling edge FE of the second sub-clock CK1-2, and thus the enabling and disabling operations of the first latch 10 and the second latch 20 may not be sequentially performed. However, this operation is an operation after the falling edge FE of the reference clock CK is formed, and thus does not exert an influence on the operation reliability of the semiconductor device 1.

Next, referring to FIGS. 6 and 7, a semiconductor device according to other exemplary embodiments will be described.

Figure 7:
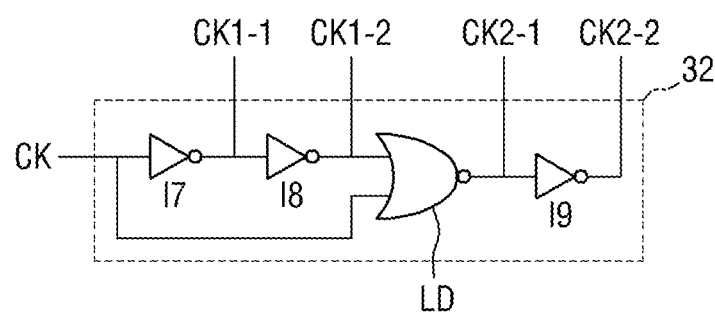

FIGS. 6 and 7 are exemplary circuit diagrams explaining a semiconductor device according to other exemplary embodiments.

Referring to FIGS. 6 and 7, a semiconductor device 2 includes a first latch 12, a second latch 22, and a clock generating unit 32.

The first latch 12 may receive input data ID based on a first sub-clock CK1-1 and a second sub-clock CK1-2 and may output the same as first output data OD1. In this embodiment, the first sub-clock CK1-1 and the second sub-clock CK1-2 may be received from the clock generating unit 32.

The second latch 22 may receive the first output data OD1 input from the first latch 12 based on a third sub-clock CK2-1 and a fourth sub-clock CK2-2, and may output the same as second output data OD2. In this embodiment, the third sub-clock CK2-1 and the fourth sub-clock CK2-2 may also be received from the clock generating unit 32.

The first latch 12 may include, for example, a first inverter I1, a first transfer gate T1, a second inverter I2, and a third inverter I3.

The first transfer gate T1 may be controlled by the first sub-clock CK1-1 and the second sub-clock CK1-2, which are provided to both terminals thereof, and may determine whether to transfer the input data ID that is inverted by and input from the first inverter I1. Specifically, the first sub-clock CK1-1 may be provided to one terminal of the first transfer gate T1, and the second sub-clock CK1-2 may be provided to the other terminal of the first transfer gate T1. As described above, the input data ID may be inverted by the first inverter I1 to be provided to the first transfer gate T1.

The second inverter I2 and the third inverter I3 may latch the input data ID that is provided from the first transfer gate T1. The latched data may be output as first output data OD1. The detailed operations of such elements will be described later.

The second latch 22 may include, for example, a second transfer gate T2 and fourth to sixth inverters I4 to I6.

The second transfer gate T2 may be controlled by the third sub-clock CK2-1 and the fourth sub-clock CK2-2, which are provided to both terminals thereof, and may determine whether to transfer the first output data OD1 that is input from the first latch 12. Specifically, the third sub-clock CK2-1 may be provided to one terminal of the second transfer gate T2, and the fourth sub-clock CK2-2 may be provided to the other terminal of the second transfer gate T2. The first output data OD1 may be provided to the second transfer gate T2 without being inverted.

The fourth inverter I4 and the fifth inverter I5 may latch the first output data OD1 that is provided from the second transfer gate T2. The latched data may be inverted through the sixth inverter I6, and may be output as second output data OD2. The detailed operations of such elements will be described later.

The clock generating unit 32 may receive the reference clock CK, and may generate the first clock CK1, that includes the first sub-clock CK1-1 and the second sub-clock CK1-2, and the second clock CK2 that includes the third sub-clock CK2-1 and the fourth sub-clock CK2-2, from the reference clock CK.

In this embodiment, the first clock CK1 and the second clock CK2 may be different from each other. Specifically, the first clock CK1 and the second clock CK2 may be generated such that at least one of edges of the first clock CK1 and the second clock CK2 becomes a non-overlap edge. More specifically, the first clock CK1 and the second clock CK2 may be generated such that the first edge of the first clock CK1 does not overlap the first edge of the second clock CK2 and at least a part of the second edge of the first clock CK1 overlaps the second edge of the second clock CK2.

Referring to FIG. 7, the clock generating unit 32 may include seventh to ninth inverters I7 to I9 and a second clock level determining unit LD.

The first sub-clock CK1-1 constituting the first clock CK1 may be generated by inverting the reference clock CK at the seventh inverter I7. The second sub-clock CK1-2 constituting the first clock CK1 may be generated by inverting the first sub-clock CK1-1 at the eighth inverter I8.

The third sub-clock CK2-1 constituting the second clock CK2 may be generated according to an output of the second clock level determining unit LD. In this embodiment, the second clock level determining unit LD may be, for example, a NOR gate which receives the reference clock CK as a first input and receives the second sub-clock CK1-2 as a second input, but the inventive concept is not limited thereto. The third sub-clock CK2-1 constituting the second clock CK2 may be the output of the second clock level determining unit LD. The fourth sub-clock CK2-2 constituting the second clock CK2 may be generated by inverting the third sub-clock CK2-1 at the ninth inverter I9.

Through the above-described configuration, an operation reliability of the semiconductor device 2 according to this embodiment can be improved. Hereinafter, this will be described in more detail with reference to FIGS. 8 and 9.

FIGS. 8 and 9 are diagrams explaining operations of a semiconductor device according to other exemplary embodiments. FIG. 8 is a diagram illustrating operation timing of the semiconductor device according to an exemplary embodiment, and FIG. 9 is a diagram illustrating outputs of the second clock level determining unit LD of FIG. 7 based on inputs thereof, according to an exemplary embodiment.

First, referring to FIG. 8, if the input data ID is applied to the first latch 12, the input data ID is directly output as the first output data OD1 through the first latch 10 (operation (1)). Specifically, since the reference clock CK is at a high level when the input data ID is applied, the first sub-clock CK1-1 becomes a low level, and the second sub-clock CK1-2 becomes a high level. Such a relationship between the reference clock CK and the first and second sub-clocks CK1-1 and CK1-2 can be easily analogized from the configuration of the clock generating unit 32 as described above in reference to FIG. 7, and thus, the detailed description thereof will be omitted.

If the first sub-clock CK1-1 is at a low level and the second sub-clock CK1-2 is at a high level, the first transfer gate T1 is turned on. Accordingly, the first latch 12 is in an enabled state, and the input data ID is latched and then is output as the first output data OD1. At this time, since the third sub-clock Ck2-1 is at a low level and the fourth sub-clock CK2-2 is at a high level, the second transfer gate T2 is turned off. That is, since the second latch 22 is in a disabled state, the first output data OD1 is unable to be latched onto the second latch 22.

Then, if a falling edge FE of the reference clock CK is formed, a rising edge RE of the first sub-clock CK1-1 is formed after a predetermined time delay through the seventh inverter I7 (operation (2)). If the rising edge RE of the first sub-clock CK1-1 is formed, a falling edge FE of the second sub-clock CK1-2 is formed after a predetermined time delay through the eighth inverter I8 (operation (3)). Accordingly, the first sub-clock CK1-1 becomes a high level and the second sub-clock CK1-2 becomes a low level. Accordingly, the first transfer gate T1 is turned off. In other words, the first latch 12 is disabled.

Here, if the second sub-clock CK1-2 becomes a low level, a rising edge RE of the third sub-clock CK2-1 is formed (operation (4)). This will be described in detail as follows. As described above, the second clock level determining unit LD according to this embodiment may include a NOR gate which receives the reference clock CK as the first input and receives the second sub-clock CK1-2 as the second input. The outputs (i.e., the third sub-clock CK2-1) of the second clock level determining unit LD according to the inputs thereof are illustrated in FIG. 9.

Since the reference clock CK is kept at a low level while the falling edge FE of the second sub-clock CK1-2 is formed, the output level is changed to a high level only when the level of the second sub-clock CK1-2 is change to a low level. Accordingly, after the falling edge FE of the second sub-clock CK1-2 is formed, the rising edge RE of the third sub-clock CK2-1 is formed (operation (4)).

Referring again to FIG. 8, if the rising edge RE of the third sub-clock CK2-1 is formed, a falling edge FE of the fourth sub-clock CK2-2 is formed after a predetermined time delay by the ninth inverter I9 (operation (5)). Accordingly, the third sub-clock CK2-1 becomes a high level, and the fourth sub-block Ck2-2 becomes a low level. Accordingly, the second transfer gate T1 is turned on. In other words, the second latch 22 is enabled. Accordingly, the first output data OD1 is latched onto the second latch 22, and then is output as the second output data OD2 (operation (6)).

If the rising edge RE of the reference clock CK is formed, the falling edge FE of the first sub-clock CK1-1 is formed after a predetermined time delay by the seventh inverter I7 (operation (7)). On the other hand, if the rising edge RE of the reference clock CK is formed, the level of the reference clock CK is changed, and as illustrated in FIG. 9, the level of the third sub-clock CK2-1 is immediately changed. Accordingly, the falling edge FE of the third sub-clock CK2-1 is formed (operation (8)). That is, the operation to form the falling edge FE of the third sub-click CK2-1 is different from the operation to form the rising edge RE of the third sub-clock CK2-1. Specifically, in order to form the rising edge RE of the third sub-clock CK2-1, it is required to additionally form the falling edge FE of the second sub-clock CK2-1 after forming the falling edge FE of the reference clock CK. However, in order to form the falling edge FE of the third sub-clock CK2-1, it is enough to form the rising edge RE of the reference clock CK only. The above-described difference in operation may be understood as the characteristic of the NOR gate constituting the second clock level determining unit LD according to this embodiment.

In accordance with the operational characteristic as described above, the rising edge RE of the third sub-clock CK2-1 constituting the second clock CK2 is unable to be formed to overlap the rising edge RE of the first sub-clock CK1-1 or the falling edge FE of the second sub-clock CK1-2, but at least a part of the falling edge FE of the third sub-clock CK2-1 constituting the second clock CK2 can be formed to overlap the falling edge FE of the first sub-clock CK1-1 constituting the first clock CK1 or the rising edge RE of the second sub-clock CK1-2.

If the falling edge FE of the first sub-clock CK1-1 and the falling edge FE of the third sub-clock CK2-1 are formed as described above, the rising edge RE of the second sub-clock CK1-2 and the rising edge RE of the fourth sub-clock CK2-2 are formed after a predetermined time delay by the eighth inverter I8 and the ninth inverter I9, respectively (operation (9)).

The semiconductor device 2 according to this embodiment as described above has the operational characteristic that is similar to the operational characteristic of the semiconductor device 1 (in FIG. 1) as described above. Accordingly, the operation reliability of the semiconductor device 2 can also be improved.

Next, referring to FIG. 10, a semiconductor device according to still another exemplary embodiment will be described.

FIG. 10 is a block diagram of a semiconductor device according to another exemplary embodiment. Hereinafter, duplicate explanation of the same contents as the contents according to the above-described embodiments will be omitted, and explanation will be made around the different points between them.

Referring to FIG. 10, a semiconductor device 3 includes a first flip-flop 41 and a second flip-flop 42. Here, at least one of the first flip-flop 41 and the second flip-flop 42 may be employed by the semiconductor devices 1 and 2 as described above. Specifically, in some exemplary embodiments, the first flip-flop 41 may include a plurality of latches that operate based on first and second clocks CK1 and CK2 which are different from each other and are generated from the reference clock CK by the clock generating unit 34. That is, any one of the semiconductor devices 1 and 2 as described above may employ the first flip-flop 41.

Further, in some exemplary embodiments, the second flip-flop 42 may include a plurality of latches that operate based on third and fourth clocks CK3 and CK4 which are different from each other and are generated from the reference clock CK by the clock generating unit 34. That is, any one of the semiconductor devices 1 and 2 as described above may employ the second flip-flop 42.

The second flip-flop 42 may include a multiplexer MUX that selects any one of the second output data OD2 and a control signal CS as an input of the second flip-flop 42. That is, under the control of the multiplexer MUS, any one of the second output data OD2 and the control signal CS may be selected as the input of the second flip-flop 42.

In some exemplary embodiments, examples of the control signal CS that is provided to the second flip-flop 42 may be a scan signal SCAN, a set signal SET, and a reset signal RESET. If the scan signal SCAN is provided as the input of the second flip-flop 42, the second flip-flop 42 may perform a scan operation. Further, if the set signal SET or the reset signal RESET is provided as the input of the second flip-flop 42, the second flip-flop 42 may output predetermined set data or reset data, respectively. As described above, it is exemplified that the control signal CS that is provided to the second flip-flop 42 is a scan signal SCAN, a set signal SET, or a reset signal RESET, but the inventive concept is not limited thereto.

On the other hand, FIG. 10 illustrates that the multiplexer MUX is included in the second flip-flop 42 only, but the inventive concept is not limited thereto. In some exemplary embodiments, the multiplexer MUX may be included in the first flip-flop 41 only. That is, according to a modified exemplary embodiment, the first and second latches 10 and 20 illustrated in FIG. 1 may constitute the first flip-flop 41 illustrated in FIG. 10, and the first flip-flop 41 may include a multiplexer that selects any one of the input data ID and the control signal CS that includes any one of the scan signal SCAN, the set signal SET, and the reset signal RESET, as the input of the first flip-flop 41.

Further, in some exemplary embodiments, the multiplexer MUX, unlike that as described above, may be included in both the first flip-flop 41 and the second flip-flop 42.

Next, referring to FIG. 11, a semiconductor device according to still another exemplary embodiment will be described.

Figure 11:
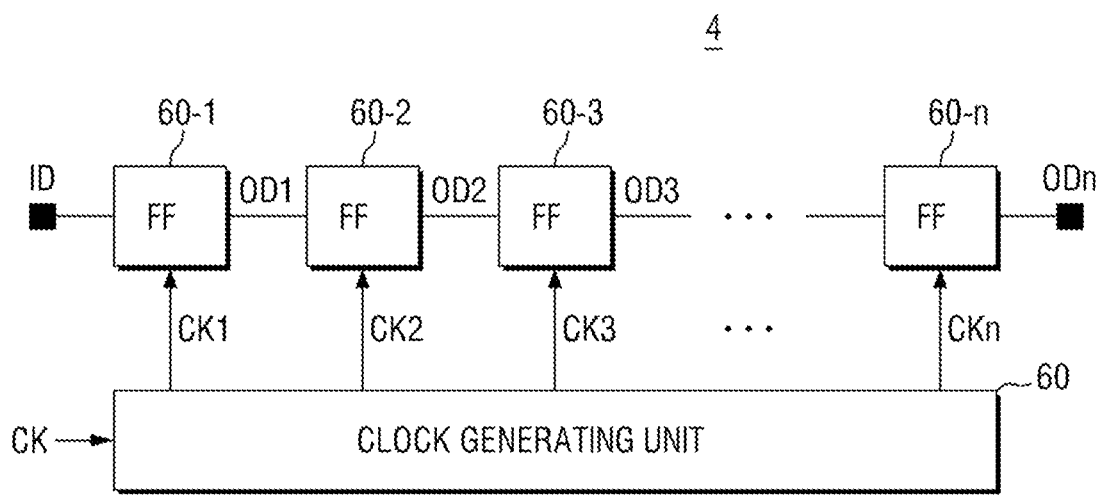
FIG. 11 is a block diagram of a semiconductor device according to another exemplary embodiment.

FIG. 11 is a block diagram of a semiconductor device according to another exemplary embodiment. Hereinafter, duplicate explanation of the same contents as the contents according to the above-described embodiments will be omitted, and explanation will be made around the different points between them.

Referring to FIG. 11, a semiconductor device 4 may include a plurality of flip-flops 60-1 to 60-n. Here, the first flip-flop 60-1 may include the semiconductor devices 1 and 2 according to the embodiments as described above. That is, the first flip-flop 60-1 may output the input data ID as the first output data OD1 based on the first clock CK1 that is composed of a plurality of clocks that are different from each other. The second flip-flop 60-2 may output the first output data OD1 as the second output data OD2 based on the second clock CK2 that is composed of a plurality of clocks that are different from each other. The third flip-flop 60-3 may output the second output data OD2 as the third output data OD3 based on the third clock CK3 that is composed of a plurality of clocks that are different from each other. By repeating the above-described processes, the n-th flip-flop 60-n that is lastly arranged may output the (n−1)-th output data OD (n−1) as the n-th output data ODn based on the (n−1)-th clock CK (n−1) that is composed of a plurality of clocks that are different from each other.

The clock generating unit 60 may provide the first to n-th clocks CK1 to CKn, each of which is composed of a plurality of clocks, to the first to n-th flip-flops 60-1 to 60-n.

Next, referring to FIG. 12, a simulation method using a semiconductor device according to an exemplary embodiment will be described.

Figure 12:
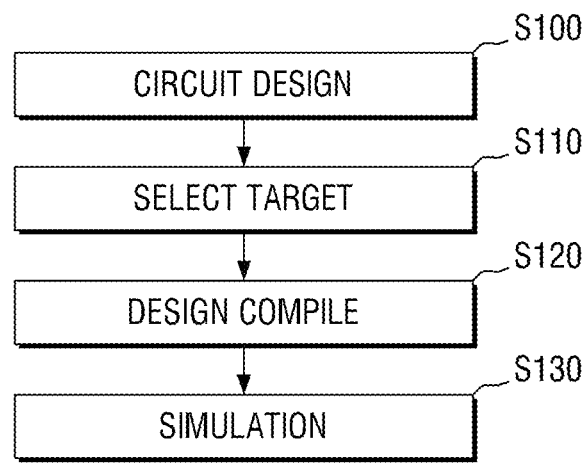
FIG. 12 is a flowchart illustrating a simulation method using a semiconductor device according to an exemplary embodiment.

FIG. 12 is a flowchart illustrating a simulation method using a semiconductor device according to an exemplary embodiment.

Referring to FIG. 12, a circuit is designed (S100). Specifically, a circuit can be designed by describing functional blocks to be designed with HDL (Hardware Description Language).

Next, among the designed functional blocks, a target block is selected (S110). Specifically, among the designed functional blocks, a block in which the above-described semiconductor devices 1 and 2 are to be used is selected as a target block, and constraint, which defines the configuration of the above-described semiconductor devices 1 and 2, is inserted into the target block.

Next, design compiling is performed (S120). Specifically, circuits that meet the inserted constraint are synthesized using a design compiler.

Next, simulation is performed (S130). Specifically, by linking a standard cell library to the synthesized circuit, for example, timing simulation is performed, and the result of the simulation is verified.

Next, referring to FIG. 13, an electronic system that can adopt a semiconductor device according to an exemplary embodiment will be described.

Figure 13:
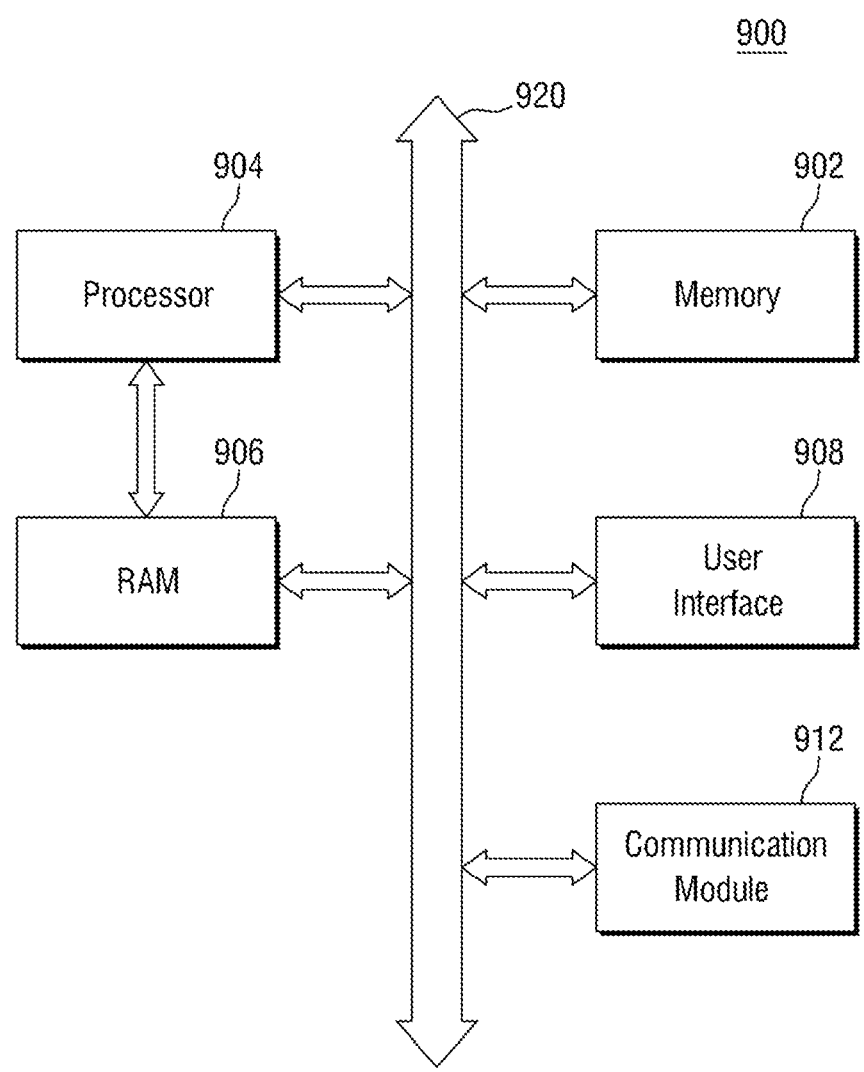
FIG. 13 is a block diagram illustrating a configuration of an electronic system that adopts a semiconductor device according to an exemplary embodiment.

FIG. 13 is a block diagram illustrating a configuration of an electronic system that can adopt a semiconductor device according to an exemplary embodiment.

Referring to FIG. 13, an electronic system 900 may include a memory system 902, a processor 904, a random access memory (RAM) 906, a user interface 908, and a communication module 912.

The memory system 902, the processor 904, the RAM 906, the user interface 908, and the communication module 912 may perform data communication with each other using a bus 920.

The processor 904 may serve to execute programs and to control the electronic system 900. The processor 904 may include at least one of a microprocessor, a digital signal processor, a microcontroller, and logic devices that can perform similar functions to the functions thereof.

The RAM 906 may be used as an operating memory of the processor 904. The RAM 906 may be, for example, a volatile memory such as a dynamic RAM (DRAM). On the other hand, the processor 904 and the RAM 906 may be implemented to be packaged into one semiconductor device or a semiconductor package.

The user interface 908 may be used to input/output data to the electronic system 900. Examples of the user interface 908 may be a keypad, a keyboard, an image sensor, and a display device.

The memory system 902 may store codes for the operation of the processor 904, data processed by the processor 904, or data input from the outside. The memory system 902 may include a separate controller for the operation, and may be configured to additionally include an error correction block. The error correction block may be configured to detect and correct an error of the data stored in the memory system 902 using an error correction code (ECC).

On the other hand, in an information processing system such as a mobile device or a desk top computer, a flash memory may be installed as the memory system 902. The flash memory may include a SSD (Solid State Device). In this case, the electronic system 900 can stably store large-capacity data in the flash memory.

The memory system 902 may be integrated into one semiconductor device. Exemplarily, the memory system 912 may be integrated into one semiconductor device to configure a memory card. For example, the memory system 902 may be integrated into one semiconductor device to configure a memory card, such as a PC card (PCMCIA (Personal Computer Memory Card International Association)), a compact flash (CF) card, a smart media card (SM or SMC), a memory stick, a multimedia card (MMC, RS-MMC, MMCmicro), a SD card (SD, miniSD, microSD, or SDHC), a universal flash storage device (UFS), or the like.

The communication module 912 may be a module that performs communication processes between the electronic system 900 and the outside. The semiconductor devices 1 to 4 according to the exemplary embodiments as described above may be adopted as one constituent element of the memory system 902 or the processor 904, but the inventive concept is not limited thereto.

Figure 14:
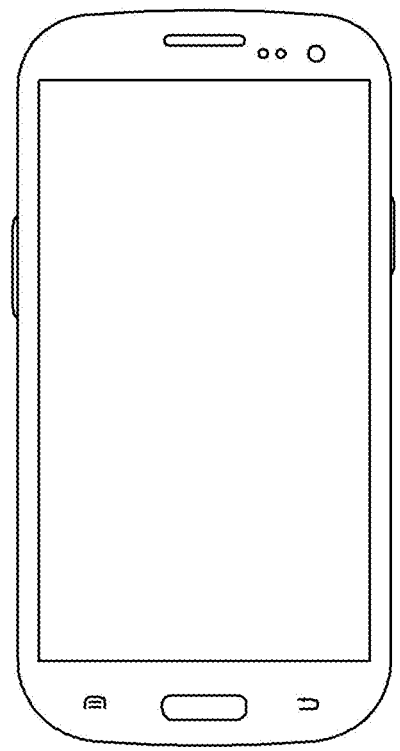
FIG. 14 is a view illustrating an example of the electronic system of FIG. 13 applied to a smart phone.

The electronic system 900 illustrated in FIG. 13 may be applied to electronic control devices of various electronic appliances. FIG. 14 is a view illustrating an application example of the electronic system 900 of FIG. 13 to a smart phone. In the case where the electronic system 900 (in FIG. 13) is applied to a smart phone 1000, the above-described electronic system 900 (in FIG. 13) may be adopted as a partial constituent element of an AP (Application Processor) that is implemented in the form of SoC.

Figure 15:
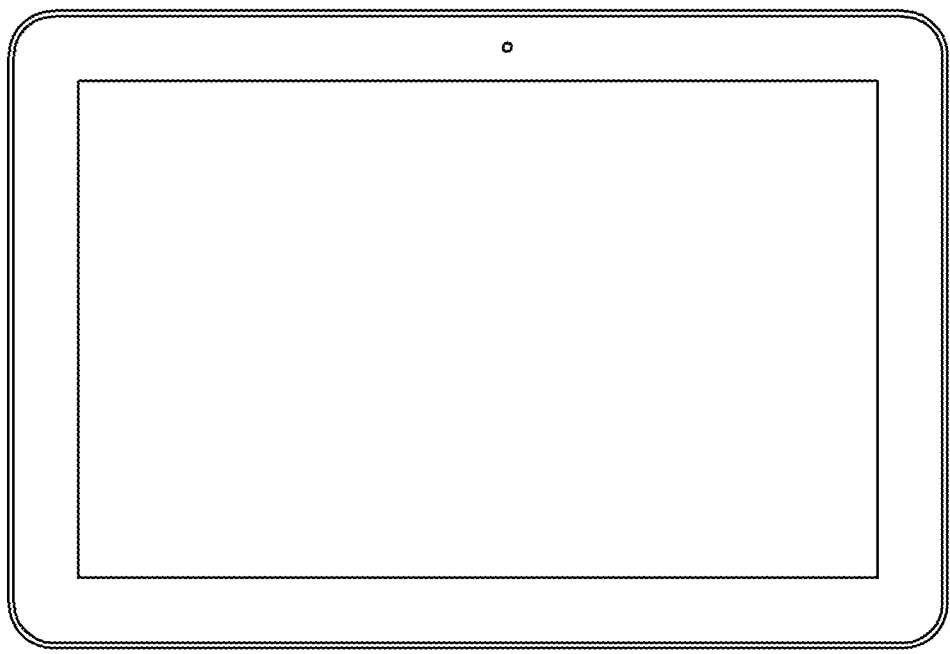
FIG. 15 is a view illustrating an example of the electronic system of FIG. 13 applied to a tablet PC.
Figure 16:
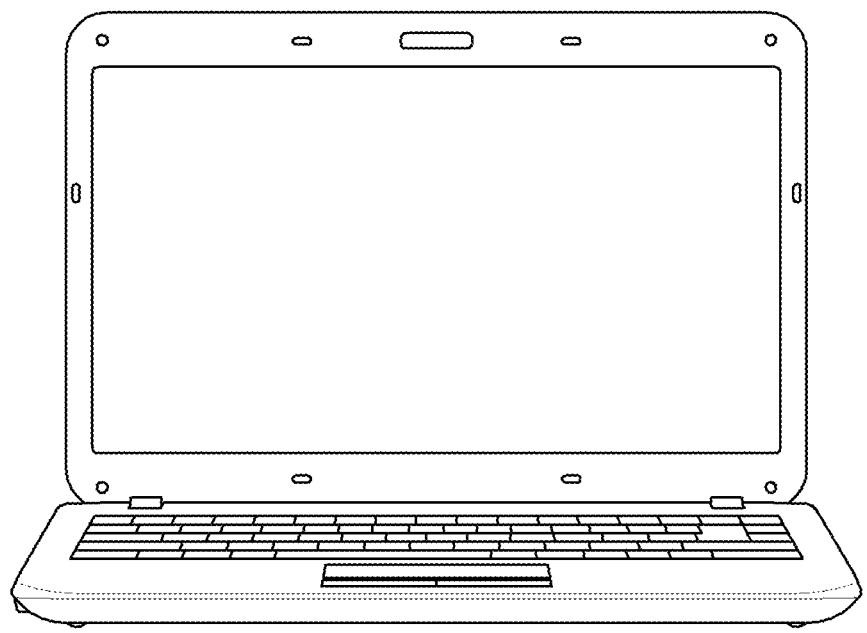
FIG. 16 is a view illustrating an example of the electronic system of FIG. 13 applied to a notebook computer.

On the other hand, the electronic system 900 (in FIG. 13) may be adopted in other various electronic devices. FIG. 15 is a view illustrating an example of the electronic system 900 of FIG. 13 applied to a tablet PC 1100, and FIG. 16 is a view illustrating an example of the electronic system 900 of FIG. 13 applied to a notebook computer 1200.

In addition, the electronic system 900 (in FIG. 13) may be provided as one of various constituent elements of electronic devices, such as a personal computer, a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, a digital video player, a device that can transmit and receive information in a wireless environment, one of various electronic devices constituting a home network, one of various electronic devices constituting a computer network, one of various electronic devices constituting a telematics network, an RFID device, or one of various constituent elements constituting a computing system.

On the other hand, in the case where the electronic system 900 (in FIG. 13) is equipment that can perform wireless communication, the electronic system 900 (in FIG. 13) can be used in communication systems, such as CDMA (Code Division Multiple Access), GSM (Global System for Mobile communication), NADC (North American Digital Cellular), E-TDMA (Enhanced-Time Division Multiple Access), WCDAM (Wideband Code Division Multiple Access), and CDMA2000.

Although exemplary embodiments have been described for illustrative purposes, those skilled in the art will appreciate that various modifications, additions and substitutions are possible, without departing from the scope and spirit of the inventive concept as disclosed in the accompanying claims.

What is claimed is:

1. A semiconductor device comprising:
a clock generating unit receiving a reference clock and generating first and second clocks that are different from each other from the reference clock;
a first latch configured to receive input data based on the first clock and to output the input data as first output data; and
a second latch configured to receive the first output data based on the second clock and to output the first output data as second output data,
wherein a first edge of the first clock does not overlap a first edge of the second clock, and at least a part of a second edge of the first clock overlaps a second edge of the second clock,
wherein the clock generating unit comprises a second clock level determining unit configured to determine a level of the second clock according to a level of the reference clock and a level of the first clock.

2. The semiconductor device of claim 1, wherein the second clock level determining unit comprises a NAND gate which receives the reference clock as a first input and receives the first clock as a second input.

3. The semiconductor device of claim 1, wherein the second clock level determining unit comprises a NOR gate which receives the reference clock as a first input and receives the first clock as a second input.

4. The semiconductor device of claim 1, wherein the first edges of the first and second clocks are generated by a rising edge of the reference clock, and
wherein the second edges of the first and second clocks are generated by a falling edge of the reference clock.

5. The semiconductor device of claim 4, wherein the first clock includes a first sub-clock having a falling edge that is generated by the rising edge of the reference clock and a rising edge that is generated by the falling edge of the reference clock, and a second sub-clock having a rising edge that is generated by the falling edge of the first sub-clock and a falling edge that is generated by the rising edge of the first sub-clock, and
wherein the second clock includes a third sub-clock having a falling edge that is generated by the rising edge of the second sub-clock and a rising edge that is generated by the falling edge of the reference clock, and a fourth sub-clock having a rising edge that is generated by the falling edge of the third sub-clock and a falling edge that is generated by the rising edge of the third sub-clock.

6. The semiconductor device of claim 1, wherein the first edges of the first and second clocks are generated by a falling edge of the reference clock, and the second edges of the first and second clocks are generated by a rising edge of the reference clock.

7. The semiconductor device of claim 6, wherein the first clock includes a first sub-clock having a rising edge that is generated by the falling edge of the reference clock and a falling edge that is generated by the rising edge of the reference clock, and a second sub-clock having a falling edge that is generated by the rising edge of the first sub-clock and a rising edge that is generated by the falling edge of the first sub-clock, and
wherein the second clock includes a third sub-clock having a rising edge that is generated by the falling edge of the second sub-clock and a falling edge that is generated by the rising edge of the reference clock, and a fourth sub-clock having a falling edge that is generated by the rising edge of the third sub-clock and a rising edge that is generated by the rising edge of the third sub-clock.

8. The semiconductor device of claim 1, wherein the first and second latches constitute a first flip-flop, and
wherein the first flip-flop selects any one of the input data and a control signal, which includes any one of a scan signal, a set signal, and a reset signal, as an input of the first flip-flop.

9. The semiconductor device of claim 8, further comprising a second flipflop configured to receive the second output data based on third and fourth clocks that are different from each other and to output the second output data as third output data, and wherein the second flip-flop includes a multiplexer that selects any one of the second output data and the control signal as an input of the second flip-flop.

10. The semiconductor device of claim 1, further comprising a plurality of flip-flops configured to receive the second output data and to output the second output data as n-th output data, wherein the clock generating unit provides a plurality of clocks that are different from one another to the plurality of flip-flops.

11. The semiconductor device of claim 1, wherein the first latch includes a master latch, and the second latch includes a slave latch, and wherein the semiconductor device includes master and slave flip-flops.

12. A semiconductor device comprising:

a first latch configured to be turned on according to first two clock signals so that input data received at the first latch is output as first output data; and a second latch configured to be turned on according to second two clock signals so that the first output data received at the second latch is output as second output data;

wherein the second latch is configured to be turned on after a predetermined time delay after the first latch is turned off, wherein the first latch comprises a first transfer gate and the second latch comprises a second transfer gate, wherein the first two clock signals are applied to two opposite terminals of the first transfer gate, respectively, and one clock signal of the first two clock signals is generated by inverting the other clock signal of the first two clock signals, wherein the second two clock signals are applied to two opposite terminals of the second transfer gate, respectively, and one clock signal of the second two clock signals is generated by inverting the other clock signal of the second two clock signals, and wherein the other clock signal of the second two clock signals is generated by either of NAND and NOR operations of a reference clock signal and the one clock signal of the first two clock signals.

13. The semiconductor device of claim 12, wherein, when the first output data is output from the first latch, the second latch is configured to be turned off.

14. The semiconductor device of claim 12, wherein, when the second output data is output from the second latch, the first latch is configured to be turned off.

15. A method for operating a semiconductor device comprising:

generating a first edge of a first clock from a first edge of a reference clock and disabling a first latch;

generating a first edge of a second clock that does not overlap the first edge of the first clock from the first edge of the first clock and enabling a second latch; and generating a second edge of the first clock from a second edge of the reference clock and enabling the first latch, and generating a second edge of the second clock that overlaps the second edge of the first clock from the second edge of the reference clock and disabling the second latch.

16. The method for generating a semiconductor device of claim 15, wherein the first edge of the reference clock includes a rising edge of the reference clock, wherein the second edge of the reference clock includes a falling edge of the reference clock, wherein the first clock includes a first sub-clock obtained by inverting the reference clock and a second sub-clock obtained by inverting the first sub-clock, and wherein the second clock includes a third sub-clock obtained by NANDoperating the reference clock and the second sub-clock and a fourth sub-clock obtained by inverting the third sub-clock.

17. The method for generating a semiconductor device of claim 15, wherein the first edge of the reference clock includes a falling edge of the reference clock, wherein the second edge of the reference clock includes a rising edge of the reference clock, wherein the first clock includes a first sub-clock obtained by inverting the reference clock and a second sub-clock obtained by inverting the first sub-clock, and wherein the second clock includes a third sub-clock obtained by NORoperating the reference clock and the second sub-clock and a fourth sub-clock obtained by inverting the third sub-clock.

* * * * *